United States Patent [19]
Austin et al.

[11] Patent Number: 4,999,694
[45] Date of Patent: Mar. 12, 1991

[54] PHOTODIODE

[75] Inventors: Richard F. Austin, Fair Haven; Robert D. Feldman, Red Bank; James W. Sulhoff, Ocean; John L. Zyskind, Shrewsbury, all of N.J.

[73] Assignee: AT&T Bell Laboratories, Murray Hill, N.J.

[21] Appl. No.: 395,922

[22] Filed: Aug. 18, 1989

[51] Int. Cl.$^5$ .................... H01L 27/14; H01L 31/00
[52] U.S. Cl. ........................ 357/30; 357/61; 357/15; 357/16; 437/126; 437/176
[58] Field of Search ............ 357/30 B, 30 C, 15, 357/61, 16; 437/126, 176; 148/DIG. 39

[56] References Cited

U.S. PATENT DOCUMENTS

| | | | |
|---|---|---|---|
| 3,723,190 | 3/1973 | Kruse et al. | 148/1.6 |
| 3,761,718 | 9/1973 | Kohn et al. | 250/211 R |
| 4,123,295 | 10/1978 | McCaldin et al. | 148/33 |
| 4,648,917 | 3/1987 | Kay et al. | 148/175 |
| 4,655,898 | 4/1987 | Kay et al. | 148/1.5 |
| 4,791,467 | 12/1988 | Amingual et al. | 357/30 |
| 4,801,990 | 1/1989 | Carpentier et al. | 357/30 |
| 4,841,351 | 6/1989 | Royer | 357/30 |

OTHER PUBLICATIONS

Stelzen et al., 'HgCdTe as an IR Det. Matrl.', Trans. on ED, #16-10, 1969.
Kohn et al., 'Micron. HgCdTe Photodectors', Trans. on ED, #16-10, 1969.
Polla et al., 'Schottky Barrier Photodiodes...', J. App. Phys., 51(9), 1980.
J. Appl. Phys., 63(9), 15 Apr. 1988, Feldman, R. D. et al., "Very High Mobility HgTe Films Grown on GaAs Substrates by Molecular-Beam Epitaxy".
J. Va. Sci. Technol., A5(5), Sep./Oct. 1987, Boukerche, M. et al., "Mercury Cadmium Telluride N-Isotype Heterojunctions Grown In Situ by Molecular Beam Epitaxy".
J. Vac. Sci. Technol., A6(4), Jul./Aug. 1988, Boukerche, M. et al., "Mercury Cadmium Telluride N-Isotype Heterojunctions Grown In Situ by Molecular Beam Epitaxy".

Primary Examiner—Thomas H. Tarcza
Assistant Examiner—John B. Sotomayor
Attorney, Agent, or Firm—Eli Weiss

[57] ABSTRACT

In this invention, there is disclosed a new photodiode which comprises a semimetal/semiconductor junction. Distortion of the bands associated with this type of junction result in current flow when an electron hole pair is formed by, for example, a photon impinging upon the junction. The photodiode operates in the photovoltaic mode. However, rather than relying on impurity doping to fabricate a p-n junction, the semimetallic nature of HgTe and its large conduction band offsets with $Hg_{1-x}Cd_xTe$ are used to create a rectifying Schottky like structure.

2 Claims, 3 Drawing Sheets

DETECTOR STRUCTURE

DETECTOR STRUCTURE
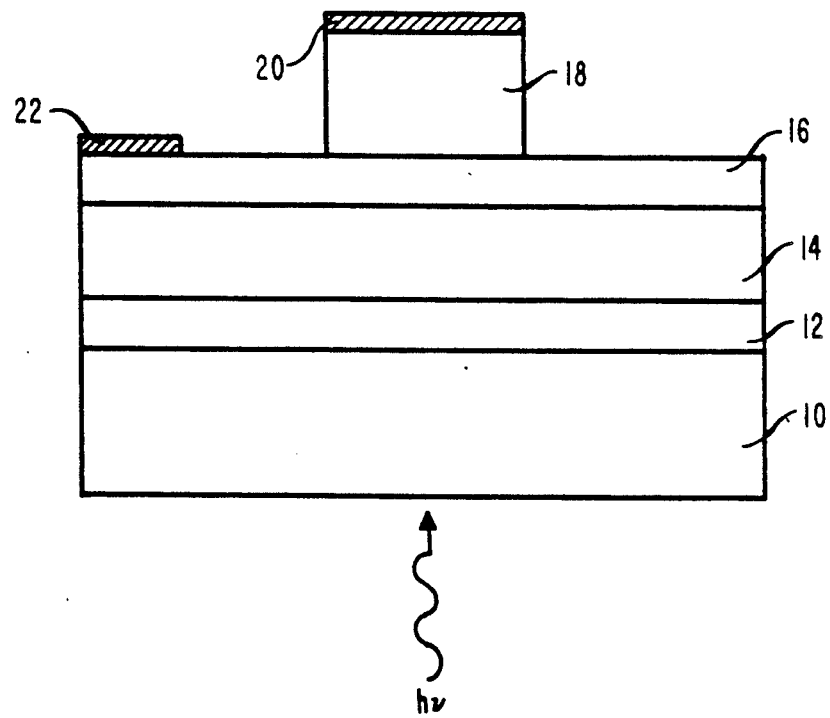
FIG. 2
SCHEMATIC BAND DIAGRAM
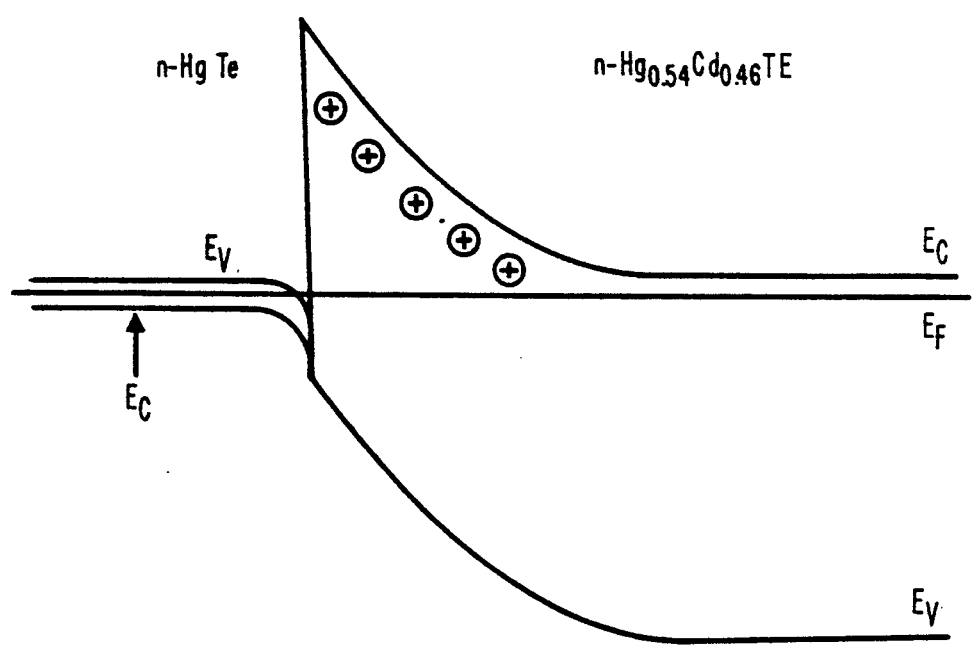

FIG.3   Hg$_{0.54}$Cd$_{0.46}$Te/HgTe DETECTOR
I-V CHARACTERISTIC
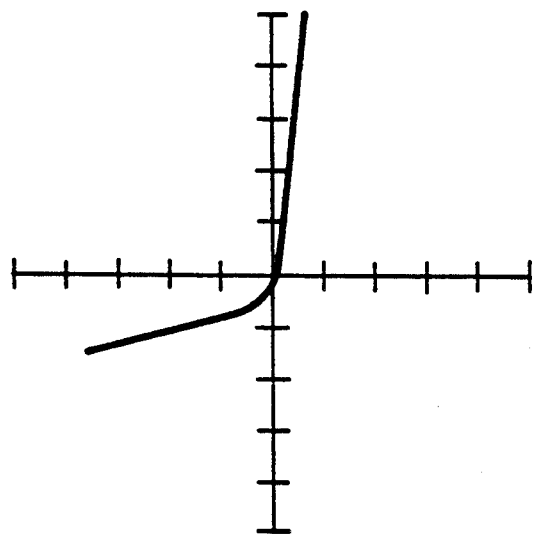
FIG.4
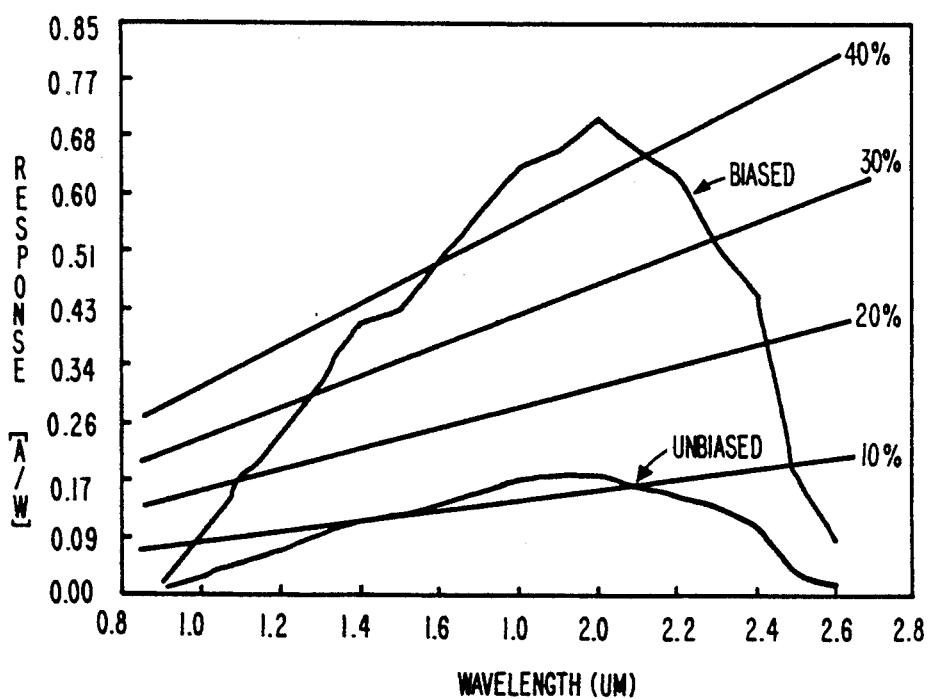

PHOTODIODE

TECHNICAL FIELD

This invention relates generally to a photodiode and more particularly to a photodiode which can be used for infrared applications.

BACKGROUND OF THE INVENTION

In recent years the alloy, mercury cadmium telluride $Hg_{1-x}Cd_xTe$ has been recognized as the most important material for mid-and long-wavelength infrared application. In the publication, in "J. Vac Sci Technol A6(4)", July/August 1988—the article entitled "Mercury cadmium telluride junctions grown in situ by molecular-beam epitaxy"—pp. 2623-26 n-isotype mercury cadmium telluride heterojunctions were made in situ by molecular beam epitaxy. The cadmium composition of both sides were doped with indium. In the "Concluding" paragraph of the publication, the statement is made that "The control of doping is also a very difficult task to achieve in this II–VI ternary alloy."

SUMMARY OF THE INVENTION

In this invention, there is disclosed a new photodiode which comprises a semimetal/semiconductor junction. Distortion of the bands associated with this type of junction result in current flow when an electron hole pair is formed by, for example, a photon impinging upon the junction. The photodiode operates in the photovoltaic mode. However, rather than relying on impurity doping to fabricate a p-n junction, the semimetallic nature of HgTe and its large conduction band offsets with $Hg_{1-x}Cd_xTe$ are used to create a rectifying schottky like structure.

The advantages of this structure are that doping is not required; the material is n-n, it is not p-n; and, the mercury cadmium telluride alloy system has a broad wavelength sensitivity. In addition, the materials are lattice matched, and, therefore, can be grown epitaxially.

BRIEF DESCRIPTION OF THE DRAWING

In the Drawing:

FIG. 1 is an illustrative embodiment of a back illuminated photodiode in accordance with the principles of the invention;

FIG. 2 is a schematic band diagram of an $n-Hg_{0.54}Cd_{0.46}Te/n-HgTe$ isotype heterojunction;

FIG. 3 is a plot of the current-voltage characteristic of a photodiode in accordance with the principles of the invention; and FIG. 4 is a plot of the spectral response and quantum efficiency of a photodiode in accordance with the principles of the invention operating at room temperature when unbiased and with a reverse bias of 250 mV.

DETAILED DESCRIPTION

Figure 5:
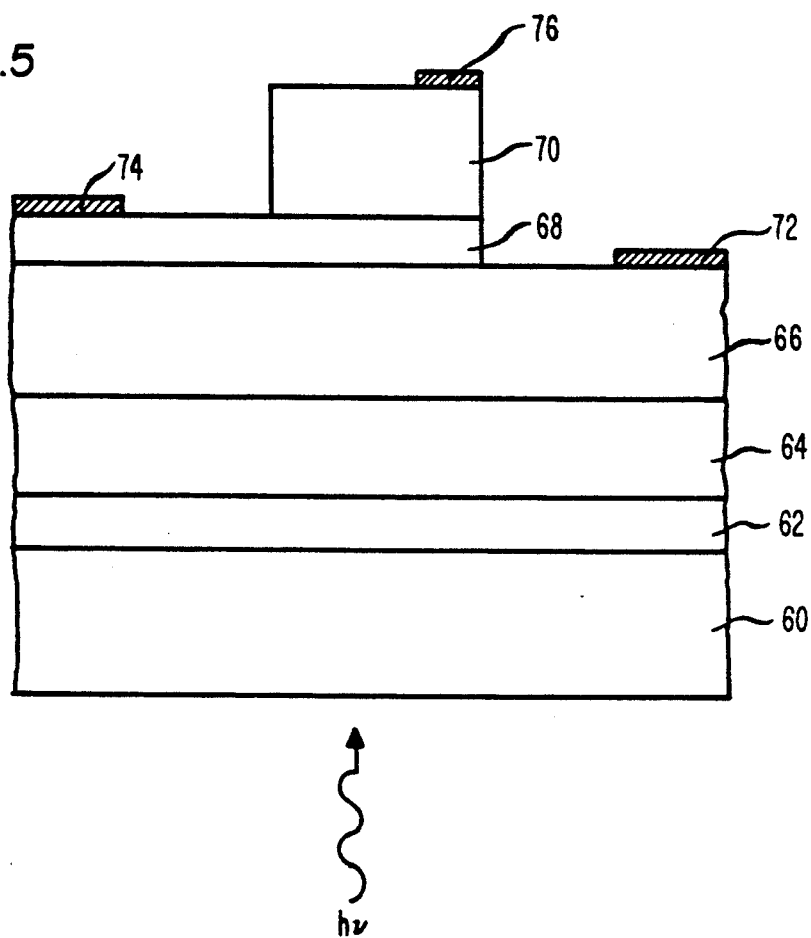
FIG. 5 is a schematic diagram of a photodiode in accordance with the principles of the invention for detecting more than one wavelength.

Referring to FIG. 1, there illustrated a cross-sectional view of a mercury cadmium telluride $Hg_{1-x}Cd_xTe$ all epitaxial semiconductor-semimetal Schottky type of photodiode in accordance with the principles of the invention. For convenience, the photodiode in FIG. 1 is not drawn to scale. In the description which follows the term "semimetal" is used. The term "semimetal" means a material having a conduction band which meets the valence band or, stated differently, the bandgap is zero or negative.

The photodiode is adapted to be back illuminated and comprises substrate layer 10 of GaAs cut and aligned for a (100) orientation. On the (100) surface of layer 10 there is grown, by known molecular beam epitaxy, a buffer layer 12 of ZnTe having a thickness of approximately 0.3 $\mu$m. A second buffer layer 14 is grown onto layer 12, the second buffer layer being of semi-insulating CdTe having a thickness of approximately 1.9 $\mu$m thick and being grown by molecular beam epitaxy.

An epitaxial semiconductor/semimetal Schottky type of photodiode is grown on the second buffer layer 14 by molecular beam epitaxy. Specifically, first, a 2000 Å thick HgTe layer 16 is grown on the CdTe layer and then a 2.25 $\mu$m thick $Hg_{0.54}Cd_{0.46}Te$ layer 18 is grown on the HgTe layer. The substrate temperature was 300° C. for each of the buffer layers 12 and 14, and 180° C. for the Hg containing layers 16, 18 (as grown by molecular beam epitaxy without intentional doping.

The HgTe layer 16 and the $Hg_{0.54}Cd_{0.46}Te$ layer 18 are each n-type having carrier concentrations, as determined from Hall measurements of single layers grown under similar conditions directly on semi-insulating CdTe buffer layers, of approximately $3 \times 10^{17}$ cm$^3$ and $5 \times 10^{15}$ cm$^{-3}$ respectively.

A diode is formed by electroplating a Au contact 20 onto the surface of the $Hg_{0.54}Cd_{0.46}Te$ layer 18, etching the mesa by using a mask of low melting temperature wax, and then plating a second Au contact 22 onto the exposed HgTe layer 16. The $Hg_{0.54}Cd_{0.46}Te$ layer 18 can be etched with a 3-2-1 etch ($3HF:2H_2O_2:1D.I.H_2O$) and the HgTe layer 16 serves as a stop-etch layer to automatically control the depth of the etch. The photodiode has an isotype heterojunction between n-type HgTe and n-type $Hg_{0.54}Cd_{0.46}Te$ which can be more generally identified as $Hg_{1-x}Cd_xTe$ where $0 < X < 1$. HgTe and Hg rich compositions of $Hg_{1-x}Cd_xTe$ are n-type as grown by molecular beam epitaxy. As X approaches 1, doping with an n-type of impurity such as indium can be used.

The ability to grow abrupt heterojunctions in the $Hg_{1-x}Cd_xTe$ alloy has made it possible to determine the band offsets in the invention here described. It is now generally accepted that the CdTe-HgTe valence band offset amounts to approximately 25% of the band gap difference. Because of the semimetallic nature of HgTe, the resulting conduction band offset is approximately 75% of the bandgap of CdTe. It is this large offset which provides the device with its unusual electrical properties.

For n-type $Hg_{1-x}Cd_xTe$ on HgTe, a rectifying barrier is formed in the conduction band of the wide bandgap material. Similarly, a smaller barrier occurs from n-isotype heterojunctions between any two compositions of $Hg_{1-x}Cd_xTe$. For $Hg_{1-x}Cd_xTe$ on the semimetal HgTe, the barrier height is approximately 75% of the band-gap and, this barrier, with the associated depletion layer, displays characteristics similar to those of a Schottky diode.

Referring to FIG. 2, there is illustrated the schematic band diagram for an $n-Hg_{0.54}Cd_{0.46}Te/n-HgTe$ isotype heterojunction. It is a fundamental property that, at the interface, the energy differences between the valence band of the HgTe and the valence band of the $Hg_{1-x}$ $Cd_xTe$ is approximately 25% of the bandgap difference. But, the band gap of the HgTe is essentially zero or negative. Therefore, the discontinuity (or offset) at the interface between the conduction bands is a very large portion of the band gap difference.

Stated differently, the discontinuity of the valence band is approximately one-quarter of the difference of the band gaps. The discontinuity in conduction bands is the difference in band gaps minus the discontinuity of the valence band. Thus, the discontinuity of the conduction bands is approximately 75% of the difference in the band gaps.

Thus, far from the interface the two conduction bands are almost at the same energy; and, close to the interface they are separated by approximately 75% of the band gap. To obtain this, a large band bending is required close to the interface. This is similar to the band bending which occurs in a p-n junction or a normal Schottky diode. Briefly, what is required is a relatively large discontinuity in the conduction bands which ideally would be substantially equal to the difference of the band gaps.

Referring to FIG. 3 there is illustrated the current-voltage characteristics of a 40 μm diameter all epitaxial semiconductor/semimetal Schottky type of photodiode made in accordance with the principles of the invention. Looking at FIG. 3 it can be seen that there is good rectification: 130μA of dark current at a reverse bias of 0.5 V at room temperature. The current-voltage characteristic illustrated in FIG. 3 can be better understood if reference is also made to the schematic band diagram of FIG. 2. Briefly, the large barrier in the $Hg_{0.54}Cd_{0.46}Te$ conduction band blocks current flow unless the $Hg_{0.54}Cd_{0.46}Te$ side of the heterojunction is biased negative. But, because of the semi-metallic nature of HgTe, the n-$Hg_{0.54}Cd_{0.46}Te$/n-HgTe heterojunction behaves as a Schottky barrier.

Reverse bias of the epitaxial semiconductor/semimetal Schottky type diode corresponds to a positive bias of the contact of the n-type $Hg_{0.54}Cd_{0.46}Te$ relative to that on the HgTe as is expected for the n:$Hg_{0.54}Cd_{0.46}Te$/n:HgTe isotype heterojunction.

The spectral response and quantum efficiency of the epitaxial semiconductor/semimetal Schottky type of diode were determined by comparison to a calibrated InSb detector using a lamp, monochromator and reflecting optics. The results are illustrated in FIG. 4 for the detector operating at room temperature when unbiased and with a reverse bias of 250 mV. It is to be noted that the depletion layer created by the $Hg_{0.54}Cd_{0.46}Te$/HgTe n-isotype heterojunction operates to separate photogenerated electron-hole pairs in the same manner as the depletion layer of a conventional p-n junction or Schottky photodiode. For operation at 80° K., the maximum quantum efficiencies were N=44% without bias and, with a reverse bias of 1.6 V ($i_d$500nA), N=44%. Considering a 30% reflection loss from the GaAs backface and the absorption loss in the HgTe layer, this efficiency represents an internal quantum efficiency which exceeds 90%.

The high quantum efficiencies noted above are representative of a structure which has not been optimized for layer thickness, carrier concentrations, passivation and/or other device characteristics. Modifications, such as reducing the thickness of the GaAs substrate and the HgTe layer that the incident light must traverse may result in higher quantum efficiencies; passivation may result in lower dark currents; and, higher quality $Hg_{0.54}Cd_{0.46}Te$ with lower carrier concentrations should result in higher unbiased responsivities.

Referring to FIG. 5, there is illustrated another embodiment of the all epitaxial semi-metal/semiconductor Schottky type of photodiode structure integrated vertically to provide a multiwavelength or multicolor detector. Specifically, onto the (100) surfaces 60 of a substrate of GaAs therein grown, by molecular beam epitaxy, a buffer layer 62 of ZnTe. A second buffer layer 64 is grown by molecular beam epitaxy onto layer 62, the second buffer layer being of semi-insulating CdTe. An epitaxial semiconductor/semimetal Schottky type of photodiode is grown on the second buffer layer 64 by molecular beam epitaxy. Specifically, an n:$Hg_{1-x1}Cd_{x1}Te$ layer 66 is grown on the CdTe layer 64, then an n-HgTe layer 68 is grown on that layer and, thereafter, an n-$Hg_{1-x2}Te$ layer 70 is grown onto the last grown layer 68. The diode is formed by electroplating a first Au contact 72 onto the surface of the first grown n-$Hg_{1-x1}Cd_{x1}Te$ layer 66; a second Au contact 74 is electroplated onto the surface of the second grown n-HgTe layer 68; and, a third Au contact 76 is electroplated onto the surface of the last grown n:$Hg_{1-x2}Cd_{x2}Te$ layer 70.

Each n-type HgCdTe layer forms an all epitaxial semimetal/semiconductor photodiode with the n type HgTe layer. If $X_2 < X_1$ the corresponding bandgap wavelengths $\lambda_{b2} > \lambda_{b1}$ and the structure is suitable for back illumination.

When the photodiode is back illuminated through the substrate, wavelengths between $\lambda_{bs}$ the substrate bandgap wavelength, and $\lambda_{b1}$ will be absorbed in the lower HgCdTe layer 66 giving rise to a photocurrent between contacts 72 and 74. Radiation of wavelengths between $\lambda_{b1}$ and $\lambda_{b2}$ are transmitted by the lower HgCdTe layer 66. Most of the light is not absorbed in the thin HgTe layer 68, but it is absorbed in the upper HgCdTe layer 70 to generate a photocurrent between contacts 74 and 76.

Figure 6:
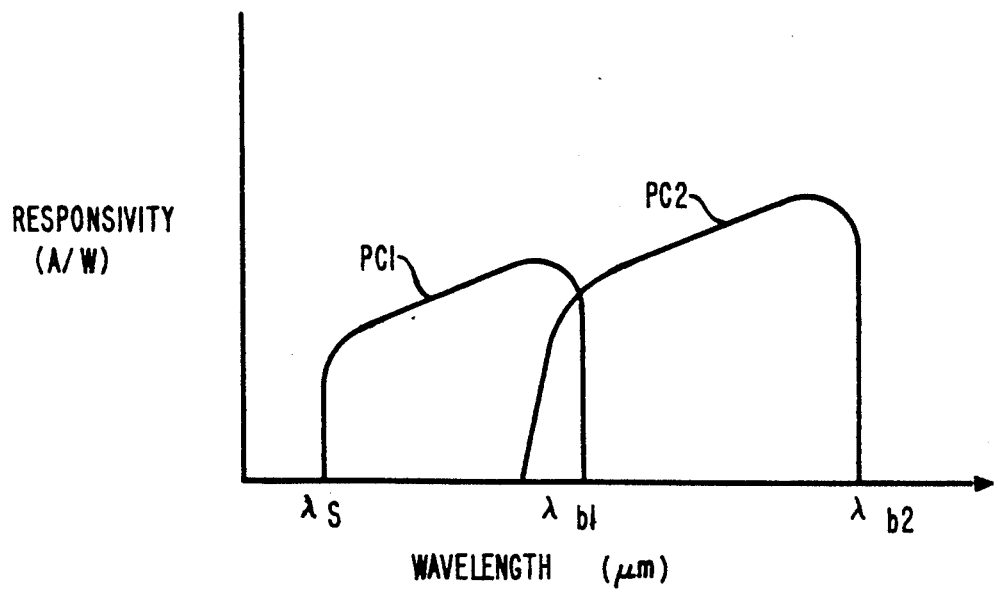
FIG. 6 is a plot of the responsivities of the device of FIG. 5.

Referring to FIG. 6, there is illustrated the responsivity vs. wavelength relationship for the device of FIG. 5. In FIG. 6, PCI represents a plot of the photocurrent between contacts 72 and 74; and, PC2 represents a plot of the photocurrent between contacts 74 and 76. Thus, in the embodiment of FIG. 5, two discrete wavelengths or colors can be detected independently and simultaneously with the same structure.

Returning to FIG. 5, the device illustrated is designed to be back illuminated when $x_2 < x_1$ and $\lambda_{b2} > \lambda_1$. If, however, the structure is to be front or top illuminated, then $x_2 > x_1$ and $\lambda_{b2} < \lambda_{b1}$.

Clearly, if desired, additional active layers interleaved with HgTe layers can be stacked vertically to detect additional wavelengths in either a front or back illuminated configuration.

Clearly, there is disclosed above, for the first time, a totally new all epitaxial semiconductor/semimetal Schottky type of photovoltaic detector having a novel band structure which exhibits rectification at room temperatures, displays high quantum efficiency photoresponse in the identified $Hg_{1-x}Cd_xTe$/HgTe n-isotype heterojunction, and is epitaxial and thus suitable for integration.

We claim:

1. A photovoltaic detector with a planar structure having a first buffer layer of semi insulating ZnTe,
   a second buffer layer of semi insulating CdTe located above said first buffer layer, an substrate of GaAs located below said first buffer layer, p1 an epitaxial semiconductor semimetal Schottky type of photodiode having an isotype heterojunction located above said second buffer layer, and first and second contacts coupled to said epitaxial semiconductor semimetal Schottly type of photodiode to provide a diode.

2. The photovoltaic detector of claim 1 wherein said epitaxial semiconductor semimetal Schottky type of photodiode comprises a layer of HgTe grown by molecular beam epitaxy without intentional doping located above said second buffer layer, a layer of $Hg_{1-x}Cd_xTe$ grown by molecular beam epitaxy without intentional doping where x is greater than 0 but less than 1 located above a portion of said layer of HgTe, said layer of HgTe forming an isotype heterojunction with said layer of $Hg_{1-x}Cd_xTe$ a first contact located above said layer $Hg_{1-x}Cd_xTe$; and a second contact located above said layer of HgTe.

* * * * *

UNITED STATES PATENT AND TRADEMARK OFFICE
CERTIFICATE OF CORRECTION

PATENT NO. : 4,999,694
DATED : March 12, 1991
INVENTOR(S) : Richard F. Austin, et al It is certified that error appears in the above-indentified patent and that said Letters Patent is hereby corrected as shown below:

Column 1, line 35, "schottky" should read -- Schottky --.

Column 1, line 63, "there" should read -- there is --.

Column 4, line 7, "surfaces" should read -- surface --.

Column 5, line 2, "p1" should be removed.

Column 5, line 2, "an epitaxial" should begin a new paragraph.

Signed and Sealed this

Fourteenth Day of September, 1993

*Attest:*

BRUCE LEHMAN

*Attesting Officer*  *Commissioner of Patents and Trademarks*